United States Patent
Pichulo et al.

(10) Patent No.: US 6,464,844 B1
(45) Date of Patent: Oct. 15, 2002

(54) SPUTTERING ALLOY FILMS USING A SINTERED METAL COMPOSITE TARGET

(75) Inventors: Robert O. Pichulo, Flint, MI (US); Gregory Keller Rasmussen, Grand Blanc, MI (US)

(73) Assignee: Delphi Technologies, Inc., Troy, MI (US)

(*) Notice: Subject to any disclaimer, the term of this patent is extended or adjusted under 35 U.S.C. 154(b) by 103 days.

(21) Appl. No.: 09/692,298

(22) Filed: Oct. 19, 2000

Related U.S. Application Data

(63) Continuation-in-part of application No. 09/667,137, filed on Sep. 21, 2000, now abandoned.

(51) Int. Cl.$^7$ .............................................. C23C 14/34
(52) U.S. Cl. ........................... 204/192.15; 204/192.12; 204/298.12; 204/298.13
(58) Field of Search .................. 204/192.12, 192.15, 204/298.12, 298.13

(56) References Cited

U.S. PATENT DOCUMENTS

| | | | |
|---|---|---|---|
| 4,824,481 A | 4/1989 | Chatterjee et al. | ............ 75/246 |
| 4,988,424 A | 1/1991 | Woodward et al. | .... 204/192.29 |
| 5,061,914 A | 10/1991 | Busch et al. | ................. 337/140 |
| 5,108,523 A | 4/1992 | Peterseim et al. | .......... 148/402 |
| 5,114,504 A | 5/1992 | AbuJudom, II et al. | .... 148/402 |
| 5,380,558 A | 1/1995 | Fujino | ..................... 427/255.5 |
| 6,033,536 A | 3/2000 | Ichihara et al. | .......... 204/192.2 |

FOREIGN PATENT DOCUMENTS

| DE | 0141685 | 5/1980 | |
|---|---|---|---|
| DE | 0142568 | 7/1980 | |
| JP | 61-291968 | * 12/1986 | ........... C23C/14/34 |

OTHER PUBLICATIONS

Takeda et al., "Composition Control of NiTi Shape Memory Alloy Films Formed by Sputter Deposition with a Composite Target", Oct. 15, 2000, Jpn. J. Appl. Phys., vol. 29, (2000), pp. 5992–5994, Part I, No. 10.*

K. Nomura, S. Miyazaki and A. Ishida, "Effect of Plastic Strain on Shape Memory Characteristics in Sputter–Deposited Ti–Ni Thin Films", Journal De Physique IV, Colloque C8, supplement au Journal de Physique III, vol. 5, Dec. 1995, pp. C8–695 to C8–700.

A. Ishida, M. Sato, A. Takei, K. Nomura, and S. Miyazaki, "Effect of Aging on Shape Memory Behavior of Ti–51.3 At. Pct Ni Thin Films", Metallurgical and Materials Transactions A, vol. 27A, Dec. 1996, pp. 3753–3759.

S. Miyazaki and K. Nomura, "Development of Perfect Shape Memory Effect in Sputter–Deposited Ti–Ni Thin Films", Proc. IEEE Micro Electro Mechanical Systems (MEMS–94), Oiso, Japan, (1994), pp. 176–181.

Akira Ishida, Morio Sato, Atsushi Takei, and Shuichi Miyazaki,"Effect of Heat Treatment on Shape Memory Behavior of Ti–rich Ti–Ni Films", Materials Transactions, JIM, vol. 36, No. 11 (1995), pp. 1349–1355.

S.A. Mathews, Manfred Wuttig, and Quanmin Su, "The Effect of Substrate Constraint on the Martensitic Transformation of Ni–Ti Thin Films", Metallurgical and Materials Transactions A, vol. 27A, Sep. 1996, pp. 2859 to 2861.

X. D. Han, W. H. Zou, R. Wang, Z. Zhang, D. Z. Yang, and K. H. Wu, "The Martensite Structure and Aging Precipitates of a TiNiHf High Temperature Shape Memory Alloy", Journal De Physique IV, Colloque C8, supplement au Journal de Physique III, vol. 5, Dec. 1995, pp. C8–753 to C8–758.

(List continued on next page.)

Primary Examiner—Steven H. Ver Steeg
(74) Attorney, Agent, or Firm—Patrick M. Griffin

(57) ABSTRACT

A method for producing thin film alloy by a sputtering deposition process comprising using a target having compartments of individual components arranged in concentric circles.

10 Claims, 2 Drawing Sheets

OTHER PUBLICATIONS

D. S. Grummon and T. J. Pence, "Thermoactive Titanium–Nickel Thin Films For Microelectromechanical Systems And Active Composites", Mat. Res. Soc. Symp. Proc. vol. 459 © 1997 Materials Research Society, pp. 331 to 343.

D. S. Grummon, Li Hou, Z. Zhao, and T.J. Pence, "Progress on Sputter–Deposited Thermotractive Titanium–Nickel Films", Journal De Physique IV, Colloque C8, supplement au Journal de Physique III, vol. 5, Dec. 1995, pp. C8–665 to C8–670.

A.D. Johnson, V. V. Martynov, and R. S. Minners, "Sputter Deposition of High Transition Temperature Ti–Ni–Hf Alloy Thin Films", Journal De Physique IV, Colloque C8, supplement au Journal de Physique III, vol. 5, Dec. 1995, pp. C–8–783 to C8–801.

P. Frach, K. Goedicke, T. Winkler, Chr. Gottfried, H. Walde, W. Hentsch, "Advantageous possibilities, design aspects and technical use of double–ring magnetron sputter sources", Surfaces and Coatings Technology vol. 74–75 (1995) 85–91.

\* cited by examiner

SPUTTERING ALLOY FILMS USING A SINTERED METAL COMPOSITE TARGET

CROSS REFERENCE TO RELATED APPLICATIONS

This application is a continuation-in-part of commonly owned and assigned U.S. patent application Ser. No. 09/667,137, filed Sep. 21, 2000 abandoned.

TECHNICAL FIELD

This invention relates to a method of producing thin film alloys by sputtering process techniques. In particular, it relates to a method of producing NiTi shape memory alloy films wherein the composition of the deposited films is adjusted through use of a sintered, metal composite target.

BACKGROUND OF THE INVENTION

Various metallic materials capable of exhibiting shape-memory characteristics are well known in the art. These shape-memory capabilities occur as the result of the metallic alloy undergoing a reversible crystalline phase transformation from one crystalline state to another crystalline state with a change in temperature and/or external stress. In particular, it was discovered that alloys of nickel and titanium exhibited these remarkable properties of being able to undergo energetic crystalline phase changes at ambient temperatures, thus giving them a shape-memory. These shape-memory alloy ("SMA") materials, if plastically deformed while cool, will revert, exerting considerable force, to their original, undeformed shape when warmed. These energetic phase transformation properties render articles made from these alloys highly useful in a variety of applications. An article made of an alloy having shape-memory properties can be deformed at a low temperature from its original configuration, but the article "remembers" its original shape, and returns to that shape when heated.

For example, in nickel-titanium alloys possessing shape-memory characteristics, the alloy undergoes a reversible transformation from an austenitic state to a martensitic state with a change in temperature. This transformation is often referred to as a thermoelastic martensitic transformation. The reversible transformation of the NiTi alloy between the austenite to the martensite phases occurs over two different temperature ranges which are characteristic of the specific alloy. As the alloy cools, it reaches a temperature ($M_s$) at which the martensite phase starts to form, and finishes the transformation at a still lower temperature ($M_f$). Upon reheating, it reaches a temperature ($A_s$) at which austenite begins to reform and then a temperature ($A_f$) at which the change back to austenite is complete. In the martensitic state, the alloy can be easily deformed. When sufficient heat is applied to the deformed alloy, it reverts back to the austenitic state, and returns to its original configuration.

SMA materials previously have been produced in bulk form, in the shape of wires, rods, and plates, for utilities such as pipe couplings, electrical connectors, switches, and actuators, and the like. Actuators previously have been developed, incorporating shape-memory alloys or materials, which operate on the principal of deforming the shape-memory alloy while it is below its phase transformation temperature range and then heating it to above its transformation temperature range to recover all or part of the deformation, and, in the process of doing so, create moments of one or more mechanical elements. These actuators utilize one or more shape-memory elements produced in bulk form, and, therefore are limited in size and usefulness.

The unique properties of SMA's further have been adapted to microelectromechanical systems ("MEMS") applications such as micro-valves and micro-actuators by means of thin film technology. Micro-actuators are desirable for such utilities as opening and closing valves, activating switches, and generally providing motion for micromechanical devices. The most well-known and most readily available SMA is an alloy of nickel and titanium. NiTi SMA has been extensively investigated as one of the most promising materials for MEMS such as microvalves and microactuators. NiTi SMA features the major advantages of having a large output force per unit volume, and the capability to serve as structural components as well as active components. It is reported that the advantageous performance of micro-actuators is attributed to the fact that the shape-memory effect of the stress and strain can produce substantial work per unit of volume. For example, the work output of nickel-titanium shape-memory alloy is of the order of 1 joule per gram per cycle. A shape-memory film micro-actuator measuring one square millimeter and ten microns thick is estimated to exert about 64 microjoules of work per cycle. With a temperature change of as little as about 10° C. this alloy can exert a force of as much as 415 MPa when applied against a resistance to changing its shape from its deformation state.

Previous processes involving MEMS have involved two fabrication techniques: machining of bulk SMA sheets or wires and deposition of SMA films from a NiTi alloy target. Unfortunately, these processes feature miniaturization and productivity limitations. Machining and assembly for MEMS devices using bulk SMA materials restricts manufacturing object size such as thickness of sheet and diameter of wire. Deposition processes have the potential of miniaturization and mass production. Deposition of a sputtered flux from a multicomponent target has been practiced for the growth of thin alloy films of a desired composition. It is known, however, that the composition of the sputtered flux varies with the polar angle of ejection from the target because of the different angular distributions of the individual target constituents. Conventional sputter deposition systems typically include a vacuum enclosure forming a sputter deposition chamber in which a circular sputter target is mounted facing opposite a wafer substrate surface. A magnetron cathode source, with means for producing a magnetic field, is set behind the circular target material. After the sputter deposition chamber has been pumped out to create a vacuum therein to the order of $10^{-5}$Pa, a sputter process gas, such as argon, is fed into the chamber and held at a fixed process pressure. The magnetron cathode generally features a center magnet and an annular magnet surrounding the outer circumferential edge of the center magnet, which develops a magnetic field across the circular target. When voltage is applied, a discharge occurs between the target and the substrate and the target material undergoes a sputtering action and a film made of the target material is deposited on the substrate. An annular erosion region is formed in a circular target, caused by rotation of the magnetic field during sputter deposition. In a typical NiTi target deposition process, small Ti plates are put on the top of the target for adjustment of the deposited composition of NiTi SMA films. The deposited film composition is controlled mainly by adjusting the number of plates. This method requires considerable expertise to determine the number, size, geometry, and position of plates, and considerable handwork to set up the apparatus.

Phase transition temperatures and thermo-mechanical properties of SMA's, such as NiTi, are extremely sensitive to compositional makeup. A small change in composition from stoichiometric NiTi causes a large change of the transformation temperature. A transformation temperature difference as large as 100° K. can result from a variation in stoichiometric Ni of only 1.0 at %, and any redundant Ti could substantially degrade the mechanical properties of the SMA material. Precise, flexible and simple compositional control is required for effective and efficient SMA film production. Accordingly, inability to adjust the composition of the films easily and precisely has thwarted practical utility of this material in many MEMS applications.

To ensure consistent transition temperatures and favorable shape-memory effect (SME) properties, composition control is the key. In NiTi thin film fabrication processing by sputtering, the first source of composition variation of thin film is from target. Therefore, target composition has to be closely controlled. To minimize oxygen contamination, typically, sputtering targets for shape-memory alloy films are fabricated using alloy process techniques involving numerous steps including melting, remelting, solidification, and even long-time homogenization treatment. Because very high temperature has to be used, these procedures often result in the preferential loss of one or more elements to the others, and the compositional control becomes very difficult. Along with high cost and long processing time, the difficulty in compositional control makes this target-making process very impractical, especially when making large size targets.

A homogenous target for sputtering deposition also is taught to be accomplished by using hot pressing powder metallurgy techniques. In addition to quicker and easier fabrication, and significantly facilitated compositional control, it further has been found that shape-memory alloy thin films produced by sputtering using such hot pressed targets exhibit good mechanical properties and SME, as well as widely ranged phase transition temperatures.

However, even with pressed powder sputter targets, precise compositional control of the blended components is still difficult and inconsistent, due to imperfect mixing of the constituent elements that comprise the target.

SUMMARY OF THE INVENTION

Now, an improved sputtering deposition method of fabricating an SMA film has been developed, whereby the compositional makeup of the sputter target, and the resultant alloy film produced, effectively can be regulated.

According to the present invention, a sputtering process is conducted wherein the sputter target is a composite of individual metal component elements rather than a mixture of the components. Each element of the desired alloy composition is positioned separately in the target in a selected pattern. The target generally is in the form of an annulus or solid disk, machined to the requirements of a target backing plate. In order to accommodate segments of pure powder metals, the annulus or disk target can be machined into individual compartments of the desired geometric shapes. These compartments then are filled with pure powder metals that comprise the multi-component target and are sintered under vacuum. It is preferable that the annulus or disk be heat treated prior to machining and sintering, in order to reduce the risk of warpage. Pursuant to the present invention, the individual component segments are arranged in the form of concentric rings extending in increasing radii from the center of the target.

It has long been known from the theory of evaporative films that ring sources can produce films with a high degree of thickness uniformity over a broad area if the substrate-to-target distance is adjusted to a certain fraction of the ring diameter. The mathematical theory underlying evaporative models is based on the fact that individual point sources emit isotropically, and that a planar array of such point sources produce by summation a flux that shows a cosine dependence on the emission angle as measured from the normal to the plane.

It now has been determined that sputtering from ring sputter sources also gives rise to a broad area of thickness uniformity, but in this case there is anisotropic emission which varies with each element. Each element flux has in its own characteristic angular dependency for flux intensity that must be determined empirically. When multiple elements are distributed in rings which are separately optimized for the given target-to-substrate working distance, and when the concentric rings are used in conjunction with a magnetron assembly that focuses the plasma flux on each ring, the result is a broad area of film with both thickness and compositional uniformity.

It has been found that targets of the present invention retain the benefits of conventional mixed metal sintered targets, producing films with a high degree of thickness uniformity; but, do not suffer from the typical disadvantage of imperfect mixing of the constituent metal elements that comprise the target, leading to inconsistent films. The presently invented concentric ring composite targets additionally retain the benefits of conventional composite targets, providing consistent film; but, do not suffer from the disadvantage of solid metal constituents, producing films with substantial thickness variation.

BRIEF DESCRIPTION OF THE DRAWINGS

The above discussed and other features and advantages of the present invention will be appreciated and understood by those skilled in the art from the following detailed description and drawings, wherein like elements are designated by like numerals in the several figures.

Referring now to the drawings.

DESCRIPTION OF A PREFERRED EMBODIMENT

Figure 1:
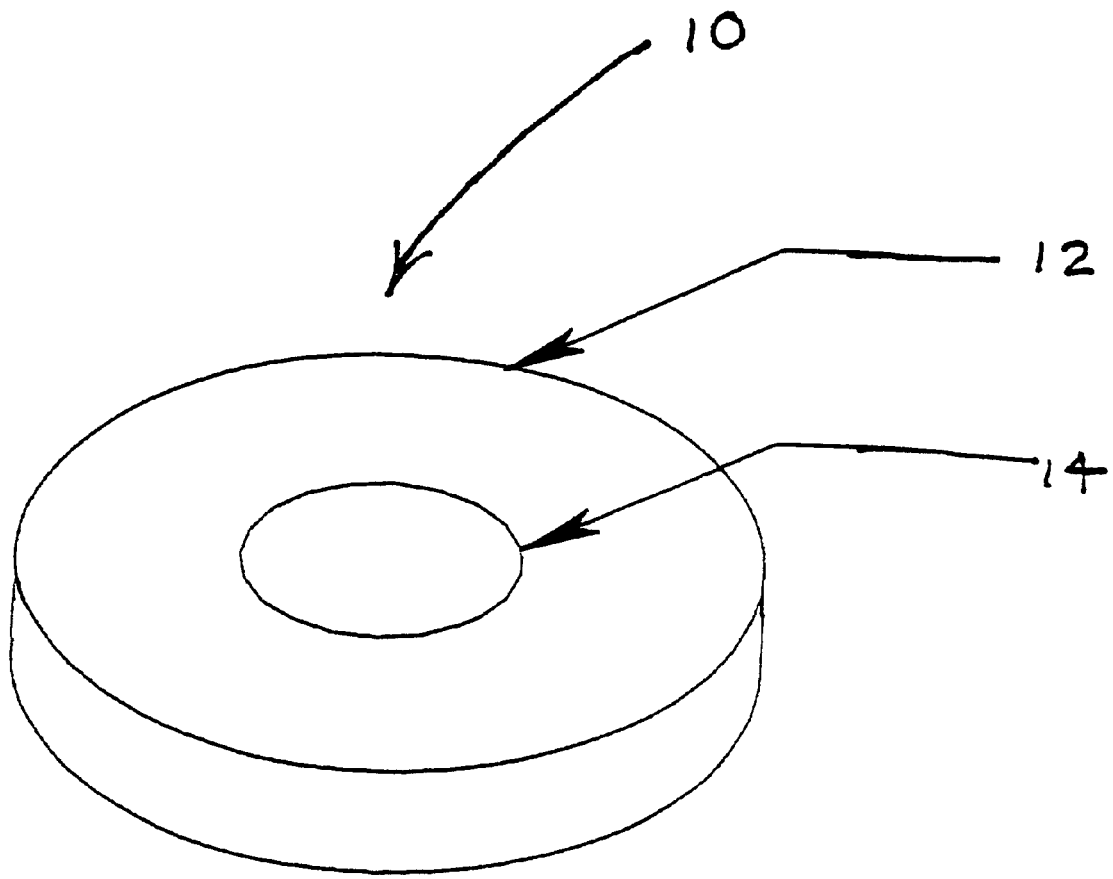
FIG. 1 is a schematic view depicting a target patterned with concentric ring compartments of individual metal components according to the present invention.

In FIG. 1, an embodiment of a sputter target, pursuant to the present invention, is depicted. The multi-component disk target 10 comprises an outer ring 12 of a titanium material, and a center core ring 14 of a nickel material.

Figure 2:
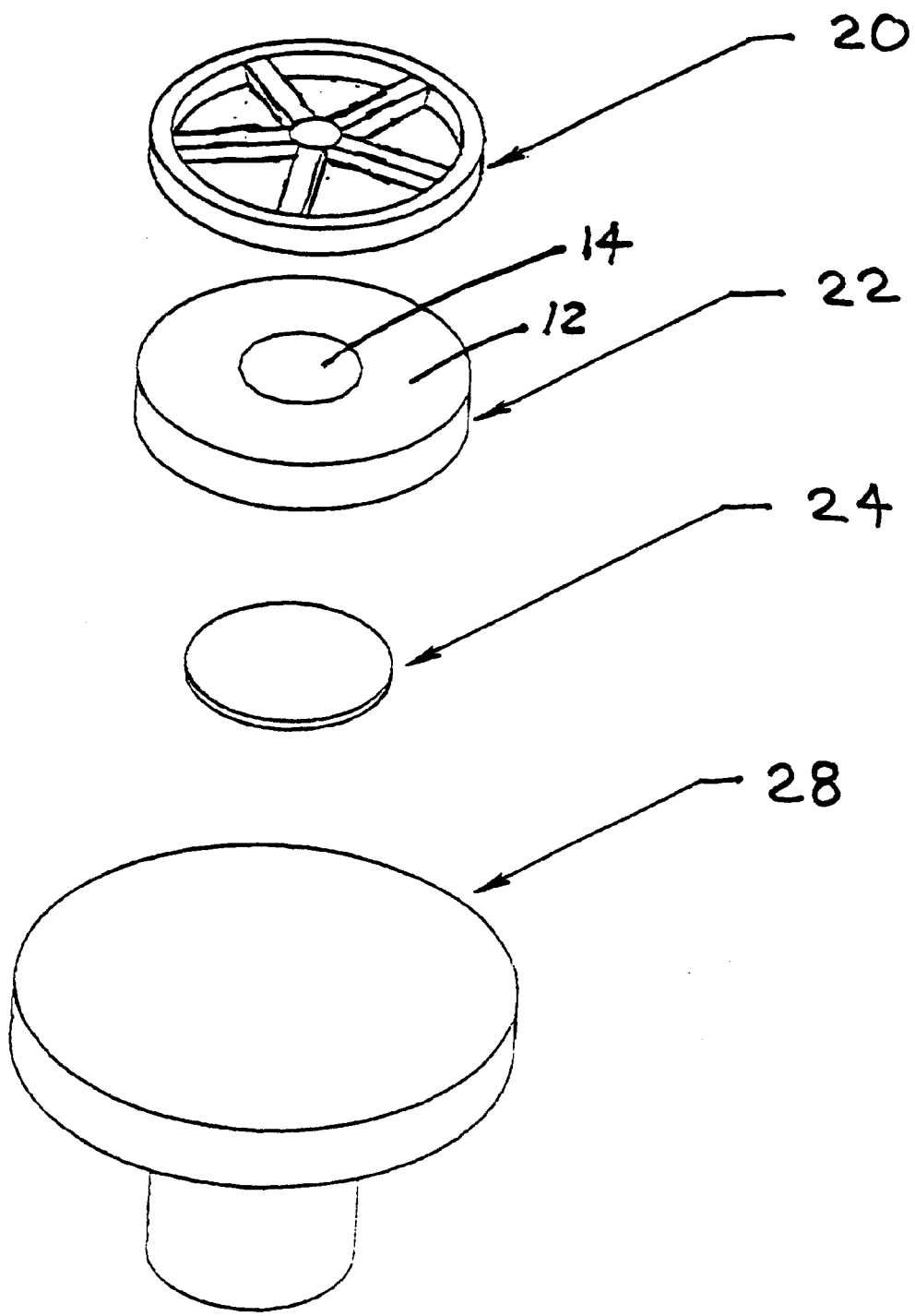
FIG. 2 is a schematic depicting arrangement of sputter deposition equipment pursuant to the present invention.

An exploded view of the components of a sputter deposition system of the present invention is illustrated in FIG. 2. In operation, the components are contained within a vacuum enclosure forming a sputter deposition chamber (not shown). A circular planar dual ring magnetron cathode source assembly 20 is positioned in alignment with and behind circular, multi-component target 22, which preferably comprises concentric rings of nickel 14 and titanium 12 containing material. A substrate 24 typically comprising a wafer of silicon or other suitable material, is set opposite target 22. The substrate 24 is mounted opposite the target 22 on fixed platen 28.

After the sputter deposition chamber is pumped out to create a vacuum therein to the order of about $10^{-5}$ Pa, a sputter process gas, such as argon, is introduced into the chamber and held at a fixed pressure. Under an accelerating voltage applied between the platen 28 and the magnetron cathode assembly 20, a discharge occurs between the target 22 and the substrate 24. The rotation of the magnetic field of the circular annular magnet of the magnetron assembly 20 deflects the ions of the created plasma in such a way as to cause the ions to be focused on the concentric component rings of the target, and impact the cathode in such a manner that the respective component target atoms are ejected as a sputtered flux. A metallic film consisting of the components of the target 22 material is caused to be accumulated on substrate 24.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

Various other embodiments of other modifications of the disclosed embodiments will be apparent to those skilled in the art upon reference to this description, or may be made without departing from the spirit and scope of the invention defined in the appended claims.

We claim:

1. A method for producing a thin film deposit of a shape-memory alloy with an ion sputtering deposition process comprising:
   conducting the sputtering deposition using a target comprising compartments of individual sintered metal components arranged in the form of concentric rings.

2. The method of claim 1 comprising conducting the sputtering deposition using a circular target plate.

3. The method of claim 1 comprising conducting the sputtering deposition using a target comprising concentric rings of Ni and Ti components.

4. A multi-component target for use in performing sputter deposition comprising a plate including compartments of sintered metal components arranged in the form of concentric rings.

5. A multi-component target for use in performing sputter deposition of shape-memory alloy films comprising:
   a plate having multiple individual component compartments arranged in the form of concentric rings.

6. The multi-component target of claim 5, wherein said plate is a circular plate having multiple individual component compartments arranged in the form of concentric rings.

7. The multi-component target of claim 5 comprising a plate having Ni and Ti components arranged in the form of concentric rings.

8. A system for performing thin film sputtering deposition comprising:
   a deposition chamber having a vacuum enclosure;
   a means for evacuating the vacuum enclosure;
   a magnetron cathode;
   a target mounted on the magnetron cathode and having a surface facing into the interior of the vacuum enclosure; and,
   a substrate positioned within the vacuum enclosure opposite the target surface;
   wherein said target comprises compartments of individual sintered metal components arranged in the form of concentric rings.

9. The system of claim 8, wherein said target is a circular plate target mounted on the magnetron cathode.

10. The system of claim 8 wherein said target comprises compartments of Ni and Ti components arranged in the form of concentric rings.

* * * * *